United States Patent [19]

Schumacher et al.

[11] Patent Number: 5,134,306
[45] Date of Patent: Jul. 28, 1992

[54] DETONATION CIRCUIT FOR A VEHICLE AIR BAG

[75] Inventors: Hartmut Schumacher, Freiberg; Norbert Crispin, Markgröningen; Bernhard Mattes, Sachsenheim, all of Fed. Rep. of Germany

[73] Assignee: Robert Bosch GmbH, Stuttgart, Fed. Rep. of Germany

[21] Appl. No.: 466,340

[22] PCT Filed: Sep. 9, 1988

[86] PCT No.: PCT/EP88/00819
§ 371 Date: May 9, 1990
§ 102(e) Date: May 9, 1990

[87] PCT Pub. No.: WO90/02672
PCT Pub. Date: Mar. 22, 1990

[51] Int. Cl.⁵ ............................................. B60R 21/16
[52] U.S. Cl. .................................... 307/10.1; 340/436; 280/735
[58] Field of Search ................ 307/9.1, 10.1; 280/734, 280/735, 728, 730, 731, 732; 340/436; 180/271, 274

[56] References Cited

U.S. PATENT DOCUMENTS

| | | |
|---|---|---|
| 3,622,974 | 11/1971 | Best .................. 280/735 X |
| 3,745,523 | 7/1973 | Lewis et al. . |
| 3,778,823 | 12/1973 | Sato et al. .................. 343/7 ED |
| 4,087,782 | 5/1978 | Oishi et al. .................. 280/735 X |
| 4,287,431 | 9/1981 | Yasui et al. .................. 307/10.1 |
| 4,414,901 | 11/1983 | Sellwood .................. 102/206 |
| 4,609,904 | 9/1986 | Paine .................. 340/54 X |
| 4,740,741 | 4/1988 | Andres et al. .................. 323/303 |
| 4,836,024 | 6/1989 | Woehrl et al. .................. 280/735 X |
| 4,933,570 | 6/1990 | Swart et al. .................. 307/10.1 |
| 4,984,464 | 1/1991 | Thomas et al. .................. 73/517 R |

FOREIGN PATENT DOCUMENTS

| | | |
|---|---|---|
| 2433555 | 1/1976 | Fed. Rep. of Germany . |
| 2850836 | 4/1980 | Fed. Rep. of Germany ...... 280/735 |
| 63-207755 | 8/1988 | Japan .................. 280/734 |

Primary Examiner—Bentsu Ro
Attorney, Agent, or Firm—Kenyon & Kenyon

[57] ABSTRACT

A detonation circuit for an inflation capsule (10) of a vehicle air bag has a capacitor (20) which supplies energy to the capsule during a crash condition. The circuit has a transformer (12), the energy source (20) being electrically connectible to the primary coil (P) thereof by two transistors (30, 48) which assume a conducting state when associated control means (16, 18) determine that a crash condition has occurred. Only when both transistors conduct can the energy source (20) cause a change in the current flow through the primary coil (P), which in turn induces a change in current in the secondary coil (S) to which the capsule (10) is connected.

It has been found that by monitoring the voltage and current characteristics in the primary coil (P), the state of the capsule (10) can be monitored. For example, it can be determined whether the capsule has fired, and if so further firing pulses may be suppressed.

26 Claims, 2 Drawing Sheets

DETONATION CIRCUIT FOR A VEHICLE AIR BAG

FIELD OF THE INVENTION

The present invention relates to detonation circuits for detonating a vehicle air bag.

BACKGROUND OF THE INVENTION

In electronic restraining systems in vehicles, e.g. an inflatable air bag to restrain an occupant in the event of a crash, the system normally takes the form of one or more sensors which detect the deceleration of the vehicle and a control unit to monitor signals from each sensor and to supply an electrical signal to detonate electrically an inflation capsule to inflate the bag if the control unit determines that a crash condition has occurred. There is a requirement for the system to be able to trigger the safety function very rapidly in the event of a crash. However, it is also necessary that the restraining system should not be inadvertently actuated, for example in the event that a crash condition is incorrectly detected or if a short circuit occurs.

It is an object of the present invention to provide a detonation circuit for detonating an air bag which meets the above requirements and overcomes the aforementioned difficulties.

SUMMARY OF THE INVENTION

The detonation circuit according to the present invention has the additional advantages that faulty triggering of the detonation capsule is prevented in virtually all cases in which faults occur in the detonation circuit. The detonation circuit according to the present invention also enables the use of one energy reserve for a plurality of detonation circuits in as economical a way as possible. It also increases the security against false triggering, caused by a fault in the circuit affecting the triggering, such that an additional mechanical, acceleration-dependent switch need not be provided.

BRIEF DESCRIPTION OF THE DRAWINGS

By way of example only, a specific embodiment of the present invention will now be described, with reference to the accompanying drawings, in which.

DETAILED DESCRIPTION

Figure 1:
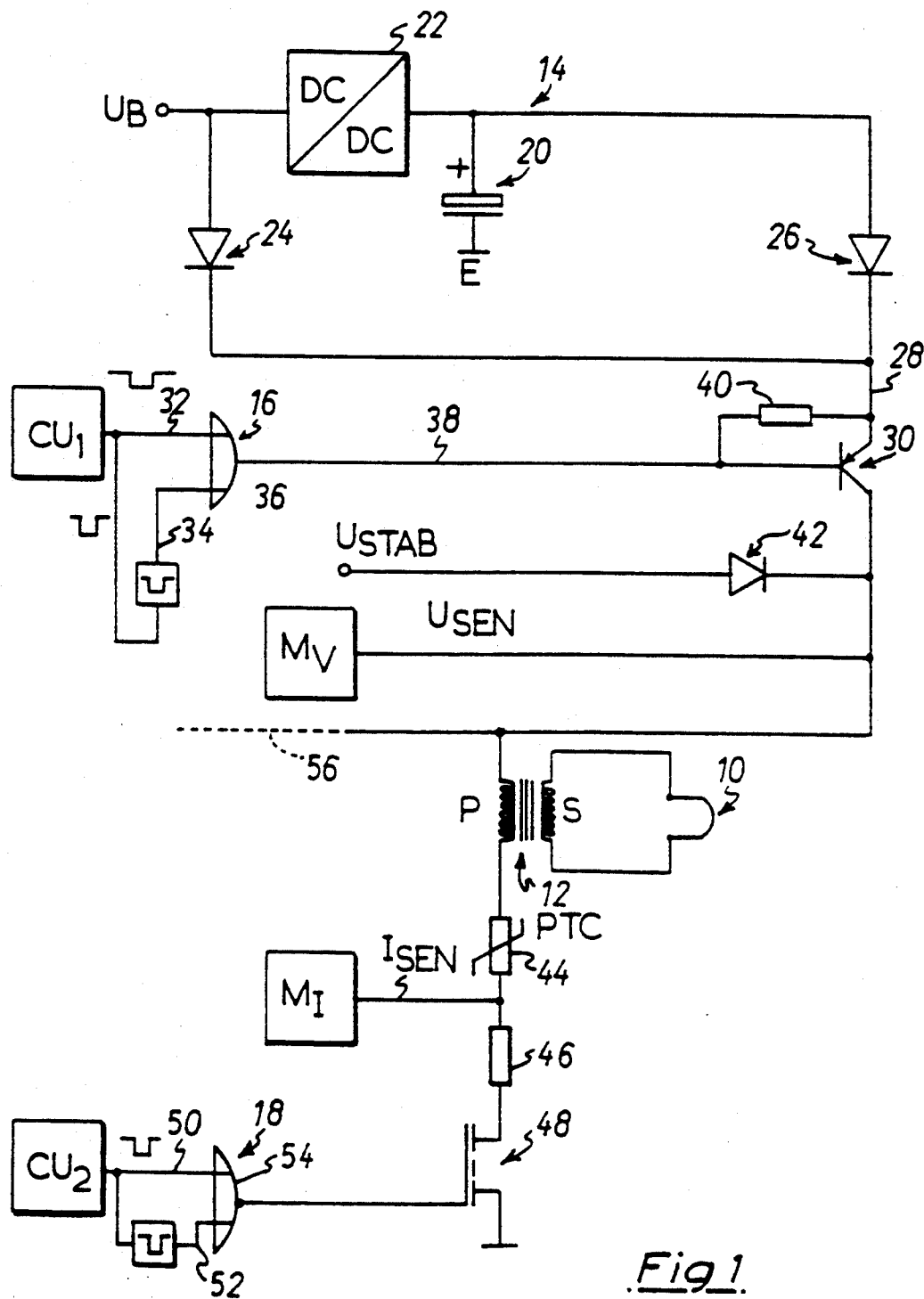
FIG. 1 is a circuit diagram of an embodiment of air bag detonating apparatus in accordance with the present invention.

The circuit shown in FIG. 1 has as its object the electrical detonation of an air bag capsule 10 during a crash in which the vehicle to which the system is fitted is involved. The inflation capsule is connected to the secondary coil S of a step-down transformer 12 having a primary coil P and a secondary coil S. The primary coil P of the transformer 12 is connected in one direction to an energy reserve, indicated generally as 14, and to a command release detonation system 16, and in the other direction to a timed firing means 18.

The energy reserve comprises a capacitor 20 which is charged up to a working voltage of 50V from a vehicle battery voltage $U_B$ by means of a conventional DC/DC converter 22. Two decoupling diodes 24, 26 are connected from the battery voltage $U_B$ and from one side of the capacitor 20 (the other side being connected to earth E) to an output lead 28 of the energy reserve system F4. A test switch transistor 30 is also connected to the output lead 28.

The output of the command release detonation system 16 is connected to the base of the transistor 30. The command release detonation system is conventional, and comprises a first input 32 which conveys signals from a control unit $CU_1$ when the control unit determines on the basis of information from a sensor (not shown) that a crash condition has occurred. A second input 34 leads from a monostable multivibrator (not shown) and both inputs are fed into an AND gate 36. Thus, when coincident signals are received by the AND gate 36 from the control unit and the monostable multivibrator, a "1" signal is output along lead 38 to the base of the transistor, and causes the transistor switch to close, i.e. to conduct. A high value resistor 40 bridges the emitter and the base of the transistor.

The collector of the transistor is connected to the primary coil P of the transformer 12. A stabilized voltage $U_{STAB}$ is also fed via a diode 42 to the input coil of the transformer 12, and a voltage sensing lead $U_{SEN}$ also leads from the primary coil of the transformer to a voltage monitoring means $M_V$. On the other side of the primary coil are connected in series a positive temperature coefficient (PTC) resistor 44, a measuring resistor 46 and a MOSFET 48.

The output of the timed firing means 18 is connected to the gate of MOSFET 48. The firing means 18 comprises an input 50 which, like input 32 of the command release detonation system 16, conveys signals from a control unit $CU_2$ when the control unit determines on the basis of information from a sensor (not shown) that a crash condition has occurred. The control unit $CU_2$ and sensor are different from those used for the command release detonation system 16. The other input 52 leads from a monostable multivibrator, and the two inputs are fed into an AND gate 54 whose output is connected to the gate of the MOSFET 48. A primary coil current sensing lead $I_{SEN}$ leads from between the PTC and measuring resistors 46, 44 to a current monitoring means $M_I$.

It should be noted that further detonation circuits can be connected to the collector of the transistor switch 30, as indicated by the dotted lead 56. Each further detonation circuit would comprise a transformer, an air bag capsule, PTC resistor, measuring resistor, input coil current sensing lead, MOSFET and timed firing means, as described above. In this way, the single energy reserve capacitor can be used to actuate more than one air bag capsule.

In use, electrical signals from the energy reserve capacitor 20 can only be supplied to the primary coil P of the transformer 12 when the test switch transistor 30 and the MOSFET 48 are rendered conductive by their respective circuits, in other words only when both control units determine independently of each other that a crash condition has occurred. However, it is also necessary for the two transistors 30, 48 to be conductive simultaneously, otherwise no pulses of current will flow to the primary coil of the transformer 12. When pulses of current are passed through the primary coil, corresponding current pulses are induced in the secondary coil of the transformer, and if the induced current is sufficiently large, detonation of the air bag capsule 10 occurs.

Figure 2:
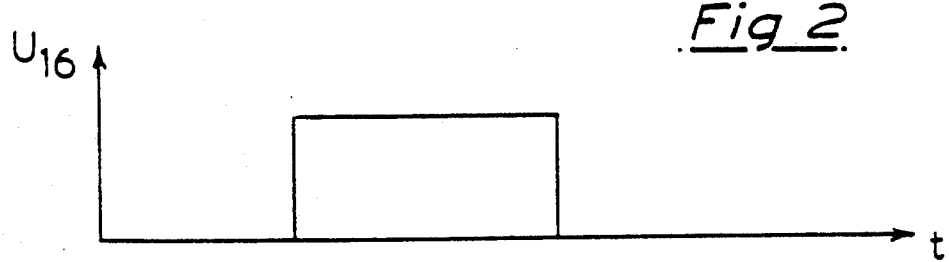
FIGS. 2 and 3 are plots of voltage against time for a test switch transistor and firing transistor respectively of the embodiment of FIG. 1.
Figure 3:
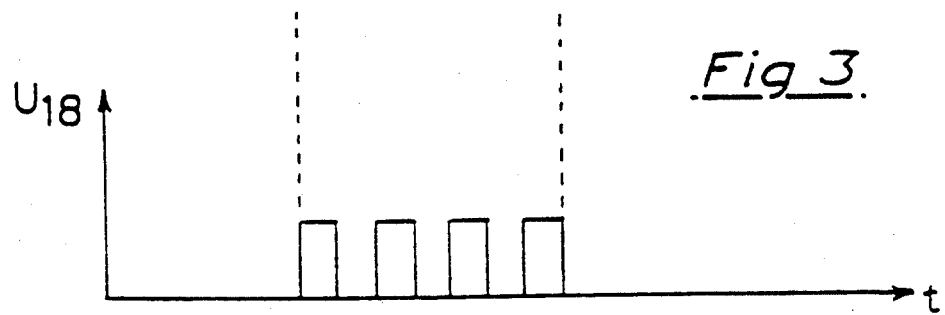

FIG. 2 shows a plot of voltage U against time t for the signal from the command release detonation system 16, in other words demonstrates the time for which the test switch transistor 30 is closed. This defines a window within which the MOSFET 48 must be rendered conductive in order for the air bag capsule 10 to be detonated. The pulses of the timed firing means 18 are illustrated in FIG. 3, which is a plot of the output voltage of the timed firing means 18 with respect to time. Thus, in FIGS. 2 and 3, it will be appreciated that the energy reserve capacitor 20 has been successively connected to the primary coil P of the transformer 12 four times within the defined window period.

When a current pulse is induced in the secondary coil and passes through the capsule 10, it has been discovered that by detecting the voltage and current characteristics of the primary coil, information can be obtained as to the state of the secondary circuit, and in particular the state of the detonation capsule 10.

It will be noted that the driving voltage in the primary circuit and the current flowing through the primary coil P are continuously detected. By detecting the characteristics of these signals slightly before each pulse of the MOSFET 48, i.e. before each triggering pulse to be released for the firing transistor 48 and comparing them with a desired characteristic stored in the voltage and current monitoring means $M_V$, $M_I$, it can be determined whether the inflation capsule 10 has fired as a result of previously supplied energy pulses, i.e. it is possible to determine whether the detonation circuit has been interrupted or whether a short circuit has occurred within the detonation circuit (for example as a result of fusing of the inflation capsule).

If either such case is detected, subsequent timed triggering of the MOSFET 48 can be suppressed immediately, or after a further safety pulse, as desired by the voltage or current monitors $M_V$, $M_I$. This is achieved by the monitoring means $M_V$, $M_I$ which detect, read and compare the detected voltage $U_{SEN}$ and the detected current $I_{SEN}$ characteristics. Thus, no further transmission of energy packages is effected to an air bag capsule 10 which has already been detonated (even after short circuiting of the capsule). This is important since it is necessary to achieve economical usage of the energy in the capacitor 20 since this may be used for further firing operations in adjacent detonation circuits, and the energy stored within the capacitor 20 should not be dissipated in a short circuited inflation capsule or in a detonation circuit whose capsule has already been detonated.

The maximum current in the primary input coil of the transformer 12 may be limited by the firing resistance of the inflation capsule 10, the ratio of the number of turns on the primary and secondary coils, the value of the measuring resistor 46 and the characteristics of the PTC resistor 44. Preferably, low firing current are chosen on the primary side by having the number of turns in the primary coil greater than that on the secondary coil and by appropriate selection of the transistors 30, 48.

During crash conditions, the state of the air bag capsule 10 is monitored using the stabilized voltage $U_{STAB}$. The stabilized voltage, which is conveniently 5V, is utilized so that the characteristics of the sensed voltage $U_{SEN}$ and $I_{SEN}$ can be used to determine the state of the detonation circuit. Also, it is possible to test the circuit when the test switch transistor 30 is still open.

Also, the size of the voltage from the stabilized voltage $U_{STAB}$ ensures that any energy transferred to the secondary side of the transformer is small, even if during testing the MOSFET 48 is rendered conductive. Thus, the voltage and current provided by $U_{STAB}$ are not of sufficient magnitude to detonate the air bag capsule 10. Information from the secondary side of the transformer can be gained by detecting the voltage and current in the primary side, and it is thus possible to determine the state of the inflation capsule 10, even though no direct measurement of the capsule characteristics is made.

We claim:

1. A detonation circuit for supplying electrical energy to an inflation capsule for inflating a restraining device, comprising:
   an electrical energy source;
   connection means for supplying electrical energy to the capsule from the energy source in response to detection of a crash condition;
   a transformer having primary and secondary coils, the energy source being electrically connectible to the primary coil by the connection means and the inflation capsule being electrically connected to the secondary coil; and
   sensing means for sensing at least one characteristic in the primary coil and comparing the sensed characteristic with stored characteristics.

2. A detonation circuit as claimed in claim 1, further comprising a plurality of switch means connected in series with the energy source, each switch means being closable independently of the others upon determination of a crash condition by an associated control means.

3. A detonation circuit as claimed in claim 2, wherein each switch means comprises a transistor.

4. A detonation circuit as claimed in claim 3, wherein one of the switch means comprises a MOSFET.

5. A detonation circuit as claimed in claim 1, wherein the at least one characteristic is selected from the group including a voltage characteristic in the primary coil and a current characteristic in the primary coil.

6. A detonation circuit for supplying electrical energy to an inflation capsule for inflating a restraining device, comprising:
   an electrical energy source;
   connection means for supplying electrical energy to the capsule from the energy source in response to detection of a crash condition;
   a transformer having primary and secondary coils, the energy source being electrically connectible to the primary coil by the connection means and the inflation capsule being electrically connected to the secondary coil; and
   voltage sensing means adapted to sense voltage characteristics in the primary coil and compare the sensed characteristics with stored characteristics.

7. A detonation circuit as claimed in claim 6, wherein the connection means is adapted to supply discrete pulses of electrical energy, the voltage sensing means sensing the characteristics before one or more pulses.

8. A detonation circuit as claimed in claim 7, wherein the voltage sensing means is adapted to suppress the supply of energy to the primary coil if the detected characteristics are unsatisfactory.

9. A detonation circuit as claimed in claim 6 further comprising current sensing means adapted to sense current characteristics in the primary coil and compare the measured characteristics with stored characteristics.

10. A detonation circuit as claimed in claim 9, wherein the current sensing means is adapted to suppress the supply of energy to the primary coil if the detected characteristics are unsatisfactory.

11. A detonation circuit as claimed in claim 6, wherein the voltage sensing means is adapted to suppress the supply of energy to the primary coil if the detected characteristics are unsatisfactory.

12. A detonation circuit for supplying electrical energy to an inflation capsule for inflating a restraining device, comprising:
an electrical energy source;
connection means for supplying electrical energy to the capsule from the energy source in response to detection of a crash condition;
a transformer having primary and secondary coils, the energy source being electrically connectible to the primary coil by the connection means and the inflation capsule being electrically connected to the secondary coil; and
current sensing means adapted to sense current characteristics in the primary coil and compare the sensed characteristics with stored characteristics.

13. A detonation circuit as claimed in claim 12, wherein the connection means is adapted to supply discrete pulses of electrical energy, the current sensing means measuring the characteristics before one or more pulses.

14. A detonation circuit as claimed in claim 13, wherein the current sensing means is adapted to suppress the supply of energy to the primary coil if the detected characteristics are unsatisfactory.

15. A detonation circuit as claimed in claim 12, wherein the current sensing means is adapted to suppress the supply of energy to the primary coil if the detected characteristics are unsatisfactory.

16. A detonation circuit for supplying electrical energy to an inflation capsule for inflating a restraining device, comprising:
an electrical energy source;
supply means for supplying electrical energy to the capsule from the energy source in response to detection of a crash condition, the supply means being adapted to supply electrical energy in discrete pulses; and
sensing means for monitoring the condition of the inflation capsule during a crash condition.

17. A detonation circuit as claimed in claim 16, further comprising a plurality of switch means connected in series with the energy source, each switch means being closable independently of the others upon determination of a crash condition by an associated control means.

18. A detonation circuit as claimed in claim 17, wherein each switch means includes a transistor.

19. A detonation circuit as claimed in claim 17, wherein the switch means includes a MOSFET.

20. A detonation circuit for supplying electrical energy to an inflation capsule for inflating a restraining device, comprising:
an electrical energy source;
supply means for supplying electrical energy to the capsule from the energy source in response to detection of a crash condition, the supply means being adapted to supply electrical energy in discrete pulses;
sensing means for monitoring the condition of the inflation capsule during a crash condition; and
a transformer having primary and secondary coils, the energy source being electrically connectible to the primary coil by the supply means, and the capsule being electrically connected to the secondary coil.

21. A detonation circuit as claimed in claim 20, wherein the sensing means comprises means for sensing voltage characteristics in the primary coil of the transformer.

22. A detonation circuit as claimed in claim 21, wherein the sensing means is adapted to compare the detected characteristics with stored characteristics and suppress the pulses supplied by the supply means upon detection of unsatisfactory characteristics.

23. A detonation circuit as claimed in claim 21, wherein the sensing means includes means for sensing current characteristics in the primary coil of the transformer.

24. A detonation circuit as claimed in claim 23, wherein the sensing means is adapted to compare the detected characteristics with stored characteristics and suppress the pulses supplied by the supply means upon detection of unsatisfactory characteristics.

25. A detonation circuit as claimed in claim 20, wherein the sensing means comprises means for sensing current characteristics in the primary coil of the transformer.

26. A detonation circuit as claimed in claim 25, wherein the sensing means is adapted to compare the detected characteristics with stored characteristics and suppress the pulses supplied by the supply means upon detection of unsatisfactory characteristics.

* * * * *

UNITED STATES PATENT AND TRADEMARK OFFICE
CERTIFICATE OF CORRECTION

PATENT NO. : 5,134,306

DATED : July 28, 1992

INVENTOR(S) : Hartmut SCHUMACHER, et al.

It is certified that error appears in the above-identified patent and that said Letters Patent is hereby corrected as shown below:

Column 2, line 2, change "F4" to --14.--.

Signed and Sealed this

Fourteenth Day of December, 1993

*Attest:*

BRUCE LEHMAN

*Attesting Officer*          *Commissioner of Patents and Trademarks*